United States Patent
Koizumi et al.

(10) Patent No.: US 10,319,911 B2
(45) Date of Patent: Jun. 11, 2019

(54) WIRING PATTERN PRODUCTION METHOD AND TRANSISTOR PRODUCTION METHOD

(71) Applicant: NIKON CORPORATION, Tokyo (JP)

(72) Inventors: Shohei Koizumi, Atsugi (JP); Takashi Sugizaki, Yokohama (JP); Yusuke Kawakami, Yokohama (JP)

(73) Assignee: NIKON CORPORATION, Tokyo (JP)

( * ) Notice: Subject to any disclaimer, the term of this patent is extended or adjusted under 35 U.S.C. 154(b) by 0 days.

(21) Appl. No.: 15/243,146

(22) Filed: Aug. 22, 2016

(65) Prior Publication Data
US 2016/0359115 A1 Dec. 8, 2016

Related U.S. Application Data

(63) Continuation of application No. PCT/JP2015/055589, filed on Feb. 26, 2015.

(30) Foreign Application Priority Data

Feb. 28, 2014 (JP) .................................. 2014-037874

(51) Int. Cl.
*H01L 51/00* (2006.01)
*C23C 18/54* (2006.01)
(Continued)

(52) U.S. Cl.
CPC ...... *H01L 51/0021* (2013.01); *C23C 18/1605* (2013.01); *C23C 18/204* (2013.01);
(Continued)

(58) Field of Classification Search
CPC ............. H01L 51/0021; C23C 18/1605; C23C 18/204; C23C 18/2086; C23C 18/285
(Continued)

(56) References Cited

U.S. PATENT DOCUMENTS 6,054,254 A * 4/2000 Sato ........................ G03F 1/78
430/270.1
2004/0164293 A1* 8/2004 Maloney ............... G03F 7/0042
257/40

(Continued)

FOREIGN PATENT DOCUMENTS

JP 2006-2201 1/2006
JP 2008-208389 9/2008

OTHER PUBLICATIONS

Photosensitive Protective Groups by J. A. Barltropp. , J. Plant and P. Schofield (Dyson Pewins Laboratory, Oxford University) Published on Jan. 1, 1966.*
International Search Report dated Apr. 7, 2015 in corresponding International Patent Application No. PCT/JP2015/055589.
International Written Opinion of the International Searching Authority dated Apr. 7, 2015 in corresponding International Patent Application No. PCT/JP2015/055589.
(Continued)

*Primary Examiner* — Herve-Louis Y Assouman

(57) ABSTRACT

A wiring pattern production method includes forming, on a substrate, a precursor film for a plating base film including a first formation material having an amino group protected by a photoreactive protecting group, forming a photoresist layer including a photoresist material on a surface of the precursor film, exposing the photoresist layer with a desired pattern of light, exposing the precursor film with a desired pattern of light to form the plating base film, developing the exposed photoresist layer, removing a deprotected protecting group, and depositing an electroless plating catalyst on the exposed surface of the plating base film.

15 Claims, 12 Drawing Sheets

(51) Int. Cl.
- *C23C 18/20* (2006.01)
- *C23C 18/16* (2006.01)
- *C23C 18/28* (2006.01)
- *C23C 18/32* (2006.01)
- *C23C 18/42* (2006.01)
- *C23C 18/30* (2006.01)
- *H01L 51/05* (2006.01)
- *H01L 51/10* (2006.01)

(52) U.S. Cl.
CPC ........ *C23C 18/2086* (2013.01); *C23C 18/285* (2013.01); *C23C 18/32* (2013.01); *C23C 18/42* (2013.01); *C23C 18/54* (2013.01); *C23C 18/30* (2013.01); *H01L 51/055* (2013.01); *H01L 51/0545* (2013.01); *H01L 51/105* (2013.01)

(58) Field of Classification Search
USPC ........................................................ 438/486
See application file for complete search history.

(56) References Cited

U.S. PATENT DOCUMENTS

| | | | |
|---|---|---|---|
| 2005/0186699 A1* | 8/2005 | Kawase | H01L 51/0021 438/99 |
| 2007/0004202 A1* | 1/2007 | Fujii | C23C 18/14 438/678 |
| 2007/0246249 A1* | 10/2007 | Kano | G03F 7/0045 174/257 |
| 2008/0314628 A1* | 12/2008 | Song | G02F 1/136286 174/257 |

OTHER PUBLICATIONS

Office Action dated Dec. 25, 2017 in related Chinese Patent Application No. 201580008353.9, 20 pgs.

Office Action dated Aug. 15, 2018 in corresponding Chinese Patent Application No. 201580008353.9, 19 pages.

\* cited by examiner

L/S = 5 μm/5 μm

WIRING

L/S = 5 μm/5 μm

WIRING

WIRING PATTERN PRODUCTION METHOD AND TRANSISTOR PRODUCTION METHOD

This application claims the benefit of priority from the Japanese Patent Application No. 2014-037874, filed Feb. 28, 2014, and this application is a continuation application of the international application PCT/JP2015/055589 filed on Feb. 26, 2015. The entire contents of the application are incorporated herein by reference.

BACKGROUND

Field of the Invention

The present invention relates to a wiring pattern production method and a transistor production method.

Related Art

Conventionally, chemical plating (electroless plating) which is a plating method using reduction due to a contact action of a material surface is known. Because no electric energy is used in electroless plating, it is possible to perform plating on a resin material or a glass which is a nonconductor.

However, hard plating materials such as a resin material and glass have a weak adhesion force with a plating film to be formed and the plating film is easily peeled due to an internal stress of the plating film and peeling such as swelling occurs.

Therefore, an etching process is performed on a surface of a substrate using a chromic acid solution or the like and the surface is chemically roughened. Thereby, because the plating film to be formed is formed to be caught by the unevenness of the roughened resin material, it is possible to obtain an adhesion force (an anchor effect).

Additionally, a method of providing a base film such as spin-on glass (SOG) or a porous SOG on a surface of a hard plating substrate and performing electroless plating on the base film (see Japanese Unexamined Patent Application, First Publication No. 2006-2201) and a method of providing a base film made of a filler component such as finely divided silica and a resin composition component on a substrate surface and performing electroless plating on the base film (see Japanese Unexamined Patent Application, First Publication No. 2008-208389) are disclosed.

SUMMARY

This electroless plating technology can be used as technology for forming a wiring pattern. That is, it is possible to form a photoresist layer (hereinafter, a resist layer) having an opening corresponding to a wiring pattern in a surface of a base film and form a wiring pattern by selectively performing electroless plating via the opening.

However, according to physical properties of the base film, a phenomenon in which a developing solution dissolves the base film at the time of development of the resist layer occurs. Also, when the adhesion force of an interface between the base film and the resist layer is low, the base film and the resist layer may be peeled apart at the interface.

When this phenomenon occurs, the resist layer is removed in a width direction more than an exposed predetermined pattern at the interface between the base film and the resist layer and the formed wiring pattern is also wider than a pattern on a design exposed on the resist layer.

An objective of an aspect according to the present invention is to provide a wiring pattern production method in which a desired pattern can be formed with high dimensional precision. Also, an objective is to provide a transistor production method in which a high-performance transistor can be produced using an electroless plating method.

According to an aspect of the present invention, there is provided a wiring pattern production method including: forming, on a substrate, a precursor film for a plating base film including a first formation material having an amino group protected by a photoreactive protecting group; forming a photoresist layer including a photoresist material on a surface of the precursor film; exposing the photoresist layer with a desired pattern of light; exposing the precursor film with a desired pattern of light to form the plating base film; developing the exposed photoresist layer and removing a deprotected protecting group; and depositing an electroless plating catalyst on the exposed surface of the plating base film.

According to an aspect of the present invention, there is provided a transistor production method including: forming at least one of a gate electrode, a source electrode, and a drain electrode on a substrate using the above-mentioned wiring pattern production method.

According to the aspects of the present invention, it is possible to provide a wiring pattern production method in which a desired pattern can be formed with high dimensional precision. It is also possible to provide a transistor production method in which a high-performance transistor can be produced using an electroless plating method.

DESCRIPTION OF EMBODIMENTS

[Wiring Pattern Production Method]

Hereinafter, a wiring pattern production method according to the present embodiment will be described with reference to FIGS. 1 to 4. Also, dimensions, ratios, etc. of components are appropriately varied to easily view drawings in all the following drawings.

Figure 1:
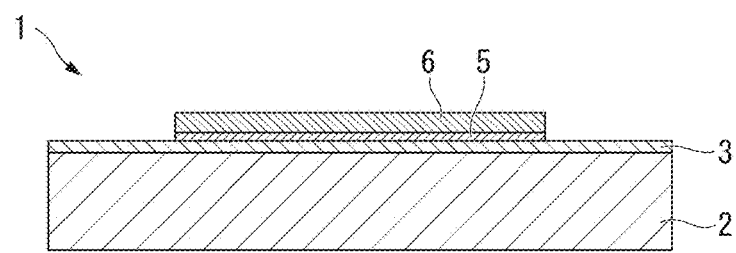
FIG. 1 is a schematic cross-sectional view of a wiring pattern produced in a wiring pattern production method of the present embodiment.

FIG. 1 is a schematic cross-sectional view of a wiring pattern produced in the wiring pattern production method of the present embodiment. A laminate 1 includes a substrate 2, a base film (a plating base film) 3, an electroless plating catalyst 5, and a wiring pattern 6.

The substrate 2 supports a wiring pattern formed on a surface thereof, and any substrate having optical transparency and any substrate without optical transparency can be used according to a specification application of the formed wiring or a purpose of a structure including the wiring. For example, glass such as quartz glass, an inorganic substance such as silicon nitride, an organic polymer (a resin) such as an acrylic resin, a polycarbonate resin, or a polyester resin such as polyethylene terephthalate (PET) or polybutylene terephthalate (PBT) can be used.

These materials of the substrate 2 do not form a metallic bond with a metallic plating film formed as a result of electroless plating. Thus, in the present embodiment, it is difficult for these materials of the substrate 2 to directly form the plating film, and the materials of the substrate 2 are handled as materials having a hard plating property in which a formed plating film is easily peeled. Also, for example, a composite material of the above-mentioned materials can also be used as a formation material of the substrate 2.

In the laminate 1 of the present embodiment, an example in which a PET resin serving as a formation material is used as the substrate 2 will be described.

The base film 3 is formed to cover the entire surface of one major surface of the substrate 2. Also, a catalyst (the electroless plating catalyst) 5 is selectively provided at a part of a surface of the base film 3.

The catalyst 5 is a catalyst for reducing metallic ions included in a plating solution for electroless plating and includes silver or metallic palladium. Metallic palladium is preferably used.

The base film 3 is a film for enabling a bond with metal which is the above-mentioned catalyst 5 to be formed, and a silane coupling agent having a group capable of being bonded to the metal is used as a formation material. The base film 3 is formed by coating a liquid substance including this silane coupling agent on the one major surface of the substrate 2.

The "silane coupling agent" which is the formation material of the base film 3 is a compound in which a group capable of being bonded with the metal which is the catalyst 5 and a group capable of being bonded to the substrate 2 are bonded with silicon atoms. Although the above-mentioned material of the substrate 2 does not form a metallic bond with the metallic plating film formed as a result of electroless plating, it is possible to preferably form the metallic plating film on the surface of the substrate 2 via the base film 3 by forming the base film 3.

Here, the "group capable of being bonded with the metal" indicates, for example, a group which enables ionic bonding or coordinate bonding to be formed with the metal which is the catalyst 5 or ions of the metal. In the present embodiment, a group (a group represented by —$NH_2$) obtained by removing one hydrogen atom from ammonia ($NH_3$) and a group (a group represented by —NHR) obtained by removing one hydrogen atom from primary amine ($NH_2R$, where R is a substituent) can be used as the "group capable of being bonded with the metal."

Also, a hydroxyl group or an alkoxy group in which the number of carbon atoms is 1 to 6 can be used as the "group capable of being bonded with the substrate 2."

As a compound available as the material for forming the base film 3, specifically, N-cyclohexyl-aminopropyltrimethoxysilane, bis (3-(trimethoxysilyl) propyl) ethylenediamine, 1-(3-(trimethoxysilylpropyl)) urea, bis (3-(trimethoxysilyl propyl)) urea, 2,2-dimethoxy-1,6-diaza-2-silacyclooctane, polyethylene imine modified by bis (3-(trimethoxysilyl) propyl) thiourea trimethoxysilylpropyl groups, etc. can be exemplified.

In the following description, the case in which the base film 3 is formed using a silane coupling agent which is the primary amine (having a group represented by —$NH_2$) will be described.

Also, although the base film 3 is formed on an entire upper surface of the substrate 2 in FIG. 1, the base film 3 may be selectively formed at only a position at which the catalyst 5 is provided. In this case, it is possible to selectively form the base film 3 by selectively coating the silane coupling agent which is a formation material of the base film 3 on the upper surface of the substrate 2 using a generally known method. Also, the silane coupling agent may be first coated in a region which is wider than a region in which the base film 3 is to be formed on the upper surface of the substrate 2. Next, the silane coupling agent may be decomposed and removed by radiating ultraviolet light to a film formed in a part protruding from the region in which the base film 3 is formed and the base film 3 may be selectively formed.

The wiring pattern 6 is a metallic electrode formed on a surface of the catalyst 5 and is formed by metal deposited on the surface of the catalyst 5 using electroless plating as will be described below. Nickel-phosphorous (NiP) or copper (Cu) is listed as a material of the wiring pattern 6.

Figure 2:
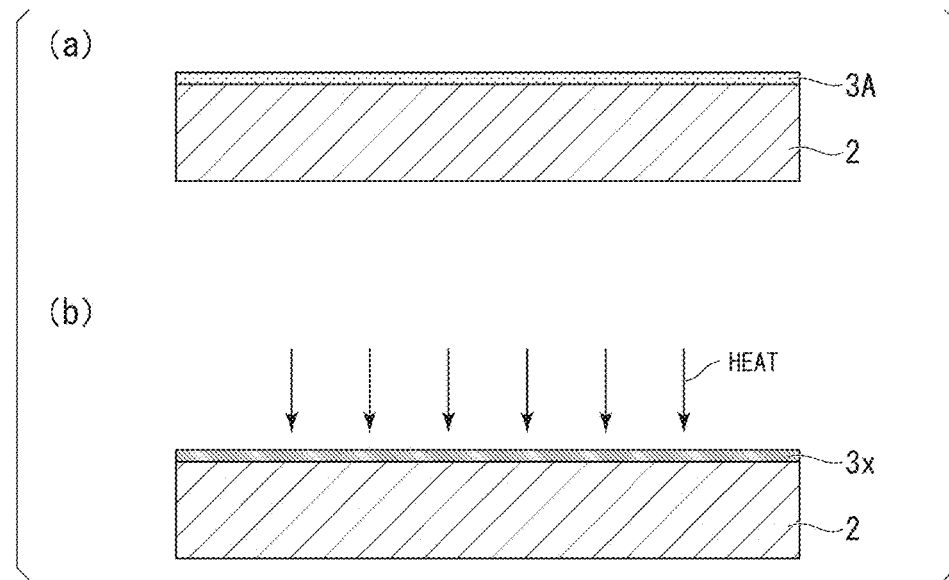
FIG. 2 is a processing diagram illustrating the wiring pattern production method.
Figure 3:
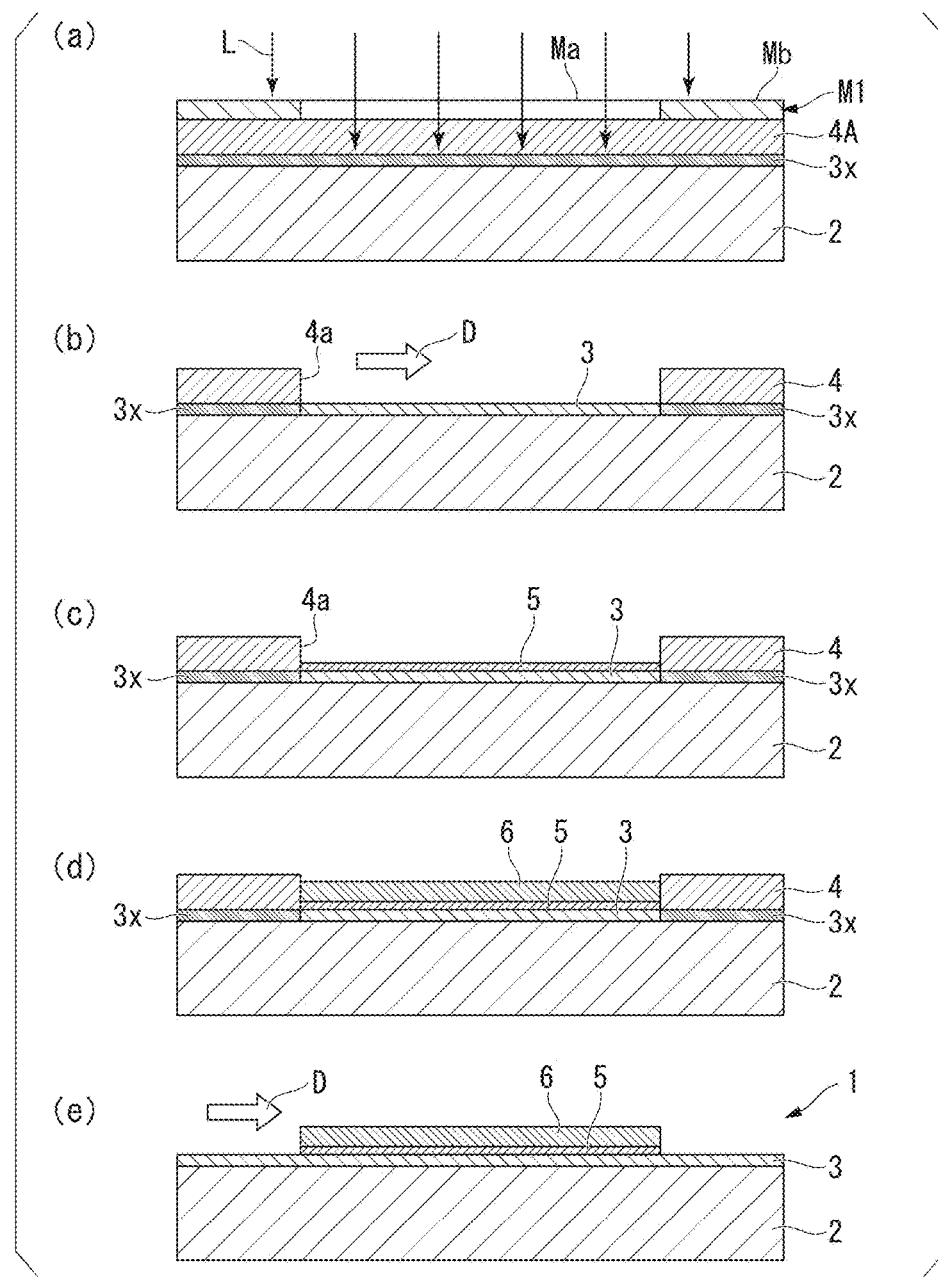
FIG. 3 is a processing diagram illustrating the wiring pattern production method.

FIGS. 2 and 3 are processing diagrams illustrating a process of producing the above-mentioned laminate 1 using the wiring pattern production method of the present embodiment.

First, as illustrated in FIG. 2(a), a liquid substance obtained by optionally dissolving a silane coupling agent which is a formation material of the base film 3 in water or an organic solvent is coated on a surface of the substrate 2 and a coating film 3A is formed. As a coating method, generally known methods such as spin coating, dip coating, spray coating, roll coating, brush coating, and a printing method such as flexographic printing or screen printing can be exemplified.

Here, in the wiring pattern production method of the present embodiment, a formation material having an amino group protected by a photoreactive protecting group is used as the silane coupling agent which is a material for forming the base film 3. The "formation material having an amino group protected by a photoreactive protecting group" corresponds to a "first formation material" in the present invention. Such a material may be used in one type or in a combination of two or more types.

The "liquid substance obtained by optionally dissolving a silane coupling agent which is a formation material of the base film 3 in water or an organic solvent" corresponds to a "liquid material" in the present description.

Also, the "amino group protected by a photoreactive protecting group" is represented by —$NHR^x$ or —$NRR^x$ ($R^x$ denotes a photoreactive protecting group).

As long as deprotection is enabled by performing substitution with a hydrogen atom and bonding with a nitrogen atom with respect to N—H bonds of an amino group and radiating light of a specific wavelength corresponding to an absorption wavelength of a protecting group, it is possible to use various known protecting groups as the "photoreactive protecting group."

An o-nitrobenzyl group or a group having an o-nitrobenzyl skeleton may be used as the "photoreactive protecting group." The "group having an o-nitrobenzyl skeleton" refers to a group obtained by appropriately replacing a hydrogen atom provided in the o-nitrobenzyl group with a substituent.

For example, a compound shown in the following formula (1) can be mentioned as the "formation material having an amino group protected by a photoreactive protecting group."

[Chem. 1]

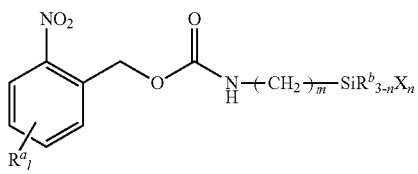

(1)

(In the formula, 1 indicates a natural number of 0 to 4, m indicates a natural number of 1 to 20, and n indicates a natural number of 1 to 3.)

$R^a$ in the formula is a substituent which will replace the hydrogen atoms bonded to the aromatic ring of an o-nitrobenzyl group. According to the replacement in $R^a$, an electron density of the o-nitrobenzyl group is changed and an absorption wavelength of the protecting group is changed. When an electron donating group such as a methoxy group or an ethoxy group is selected as $R^a$, the absorption wavelength of the protecting group is shifted to a long wavelength side. Also, when an electron withdrawing group such as halogen atoms is selected as $R^a$, the absorption wavelength of the protecting group is shifted to a short wavelength side.

$R^b$ in the formula is, for example, an alkyl group having 1 to 20 carbon atoms or an aryl group. Also, X in the formula is, for example, a halogen atom or an alkoxy group having 1 to 20 carbon atoms. n is preferably 2 or 3 and 3 is more preferable.

Here, the use of a compound shown in the following formula (2) obtaining by protecting 3-aminopropyltriethoxysilane which is a primary amine in a photoreactive protecting group as the material for forming the base film 3 will be described. The compound shown in formula (2) is a compound in which, in the above-mentioned formula (1), IV is a methoxy group, X is a methoxy group, l=2, m=3, n=3, and two $R^a$ are bonded with fourth and fifth places of a benzene ring.

[Chem. 2]

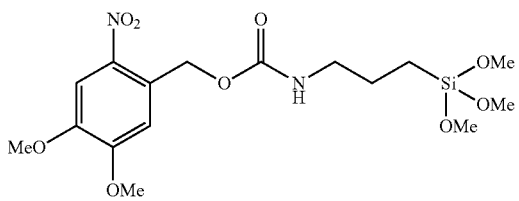

(2)

A reaction formula of deprotection of the compound shown in formula (2) is as shown in the following formula (3). The compound shown in formula (2) generates the deprotection reaction of the following formula (3) by absorbing ultraviolet light of 365 nm.

[Chem. 3]

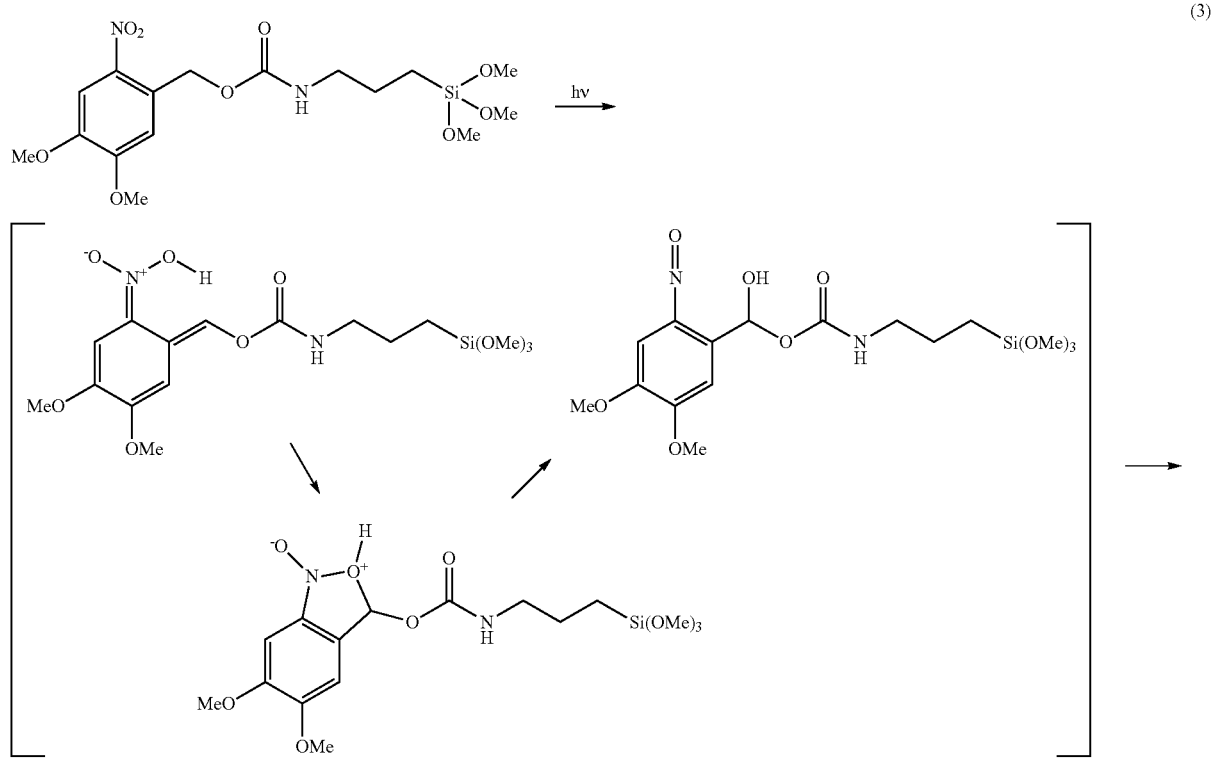

(3)

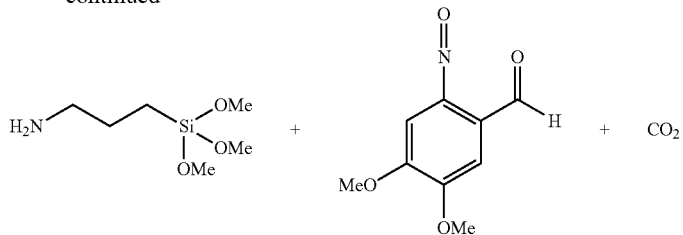

Such a protecting group is an organic group, and polarization in an N—H bond disappears in the amino group by protecting the amino group in such a protecting group. Accordingly, the amino group protected by the protecting group has relatively lower hydrophilicity and higher lipophilicity than a corresponding amino group which is not protected.

Also, a difference of solubility of the formation material according to the presence or absence of a protecting group can be confirmed by preliminary experiments and theoretical calculations. For example, it is possible to estimate an octanol/water partition coefficient (Log P), which serves as an index of water solubility, as an index of hydrophilicity or lipophilicity, and make a determination by comparing values. It can be determined that fat solubility is higher when the Log P is larger and that water solubility is higher when the Log P is smaller. It is possible to adopt, for example, a value calculated using a function attached to chemical structure drawing software (ChemDraw Pro V12 made by PerkinElmer, Inc.) as the Log P.

As the organic solvent, various organic solvents can be used as long as the formation material of the base film 3 can be dissolved therein. Among these organic solvents, a polar solvent can be preferably used. Examples of the available solvent may include: alcohols such as methanol, ethanol, 1-propanol, and 2-propanol (isopropyl alcohol (IPA)); ethers such as propylene glycol monomethyl ether acetate (PG-MEA); aromatic hydrocarbons such as toluene; nitriles such as acetonitrile; esters such as an acetic acid ester; and ketones such as acetone, methyl ethyl ketone, and methyl isobutyl ketone.

Also, when the solubility of the formation material of the base film 3 is low for the selected organic solvent, a generally known process such as appropriate heating or ultrasonic irradiation may be performed and dissolution may be promoted. Further, when the formation material of the base film 3 in the adjusted liquid substance remains soluble, a solution of the formation material of the base film 3 may be used in the formation of a coating film 3A by performing a solid-liquid separation process such as filtration or centrifugation.

Next, as illustrated in FIG. 2(b), the organic solvent is volatilized and removed by a heat treatment to form a precursor (a precursor film 3x) of the base film 3. The base film 3 formed in this manner is a silane coupling agent layer having an extremely thin film thickness, and therefore becomes a transparent film in which light scattering does not easily occur. For example, if the wiring pattern produced by the method of the present embodiment is provided on a substrate having optical transparency, it is possible to maintain the optical transparency as a whole of a combination of the substrate 2 and the precursor film 3x even when the precursor film 3x is formed on the entire surface of the substrate 2, and it is possible to easily form the film.

Next, as illustrated in FIG. 3(a), a photoresist material (hereinafter, a resist material) is coated on the precursor film 3x to form a resist layer 4A which is not patterned by pre-baking the coated photoresist material. As the resist material, a positive photoresist is used here.

Also, as the resist material, at least a material in which the formation material of the precursor film 3x is exposed to light of a wavelength at which a deprotection reaction occurs, and therefore solubility for a developing solution is changed and may be used. Using such a material, it is possible to commonly make a light source used in an exposure to be described below and to simultaneously perform an exposure for the precursor film 3x and an exposure for the resist layer.

Considering a peak wavelength and a half width of an ultraviolet light source to be generally used, for example, it is preferable to simultaneously perform the exposure for the precursor film 3x and the exposure for the resist layer by setting an absolute value of a difference between a peak value of the absorption wavelength of the resist material and a peak value of the absorption wavelength of the photoreactive protecting group to a value of 0 nm or more and 100 nm or less.

Because the precursor film 3x has an amino group protected by the photoreactive protecting group, the precursor film 3x has higher lipophilicity than the base film 3 having an amino group which is not protected. Therefore, an adhesion force with the resist layer is relatively high.

Thereafter, an opening Ma is provided at a position corresponding to a region for forming a metal electrode, and ultraviolet light L is radiated to the resist layer 4A via a mask M1 having a light shielding portion Mb in a region in which no metal electrode is formed. At this time, pattern light according to a pattern of openings Ma of the mask M1 is radiated to the resist layer 4A and the resist layer 4A is exposed.

At this time, among the ultraviolet light L radiated to the resist layer 4A, a remainder which is not absorbed by the resist layer 4A is transmitted through the resist layer 4A and reaches the precursor film 3x. In other words, by ultraviolet light irradiation via the mask M1, the resist layer 4A and the precursor film 3x can be simultaneously exposed.

Then, in a part exposed in the precursor film 3x, deprotection by light reaction shown in the above-mentioned formula (3) proceeds. That is, in the part exposed in the precursor film 3x, a group represented by —NH₂ occurs through deprotection, and a base film similar to what is formed when using 3-aminopropyltriethoxysilane is generated. That is, a boundary between the base film 3 generated through exposure and the precursor film 3x remaining without being exposed can be clearly formed.

Next, as illustrated in FIG. 3(b), development is performed by removing the resist layer until the base film 3 is exposed in correspondence with the pattern light in contact with a developing solution D to dissolve the resist layer exposed by the pattern light. As the developing solution D, for example, an aqueous solution such as a tetra-methyl-ammonium-hydroxide (TMAH) solution can be used. Thereby, the resist layer 4 having an opening 4a is provided.

In this case, a protecting group desorbed from the precursor film 3x by exposure is also removed at the same time.

Further, because the precursor film 3x has the amino group protected by the photoreactive protecting group, the adhesion force with the resist layer is relatively higher than that with the base film 3. Also, because hydrophilicity is low, solubility for the developing solution D is low. Thus, it is difficult for the precursor film 3x to be dissolved during development and it is possible to prevent floating of the resist layer by dissolving the precursor film 3x overlapping the resist layer in two dimensions.

Next, as illustrated in FIG. 3(c), the catalyst 5 used in electroless plating is deposited on a surface of the base film 3 exposed through the opening 4a formed in the resist layer 4. Specifically, metal, which is the catalyst 5, is deposited on the base film 3 by contacting a colloidal solution of divalent palladium salt.

A general electroless plating process of a resin proceeds in the order of washing, etching, catalyst imparting, and then electroless plating. Here, "catalyst imparting" is a process of attaching metal such as palladium (Pd), serving as an electroless plating reaction initiator (a catalyst), to a surface of a region for carrying out plating. Generally, "catalyst imparting" includes a process of bringing a colloidal solution of divalent palladium salt and divalent tin (Sn) salt into contact with a substrate to be attached to by palladium and then immersing the substrate coated with the colloidal solution in an acid or alkali solution, called an accelerator. Thereby, the divalent palladium is reduced to zero-valent palladium, and the catalyst is activated.

In contrast, as described in the present embodiment, it was confirmed by the inventors that, if the silane coupling agent, which is a formation material of a base film, is a primary amine or a secondary amine, a reduction treatment using the above-mentioned accelerator is not required. Thus, when a primary amine or a secondary amine is used as the silane coupling agent, the operation of electroless plating is simplified. In the present embodiment, because 3-aminopropyltriethoxysilane, which is a primary amine, is used as the formation material of the base film 3, a reduction treatment is not required and the operation is simplified.

Next, as illustrated in FIG. 3(d), an electroless plating solution is brought into contact with the catalyst 5. Thereby, metal ions dissolved in the electroless plating solution are reduced and deposited on a surface of the catalyst 5, and the wiring pattern 6 containing nickel phosphorus as a formation material is selectively formed in the opening 4a. When the silane coupling agent is a primary amine or a secondary amine, the catalyst 5 is immersed in the electroless plating solution without performing activation using an accelerator, and thereby the surface of the catalyst 5 is plated. Therefore, it is possible to indirectly confirm that metallic palladium is deposited on the surface of the base film 3.

Next, as illustrated in FIG. 3(e), the entire surface of a remaining resist layer is exposed to ultraviolet light. Through the exposure, in the precursor film 3x of a part which does not overlap the resist layer 4 in two dimensions, the deprotection reaction proceeds and the base film 3 is formed. Thereafter, the resist layer and the desorbed protecting group are removed by the generally known developing solution D. In this manner, the laminate 1 having the wiring pattern 6 is formed.

According to the above-mentioned wiring pattern production method, the dissolution of the precursor film 3x is prevented during development and floating of the suppression resist layer is prevented. Also, the boundary between the base film 3 generated through the exposure and the precursor film 3x remaining without being exposed can be clearly formed. Thus, a width of the base film 3 can be the same as a width of the opening 4a formed in correspondence with the pattern light, and a desired wiring pattern can be formed with high dimensional precision.

Also, in the above-mentioned wiring pattern production method, exposure of the resist layer to ultraviolet light after the formation of the wiring pattern 6 is not limited thereto.

Figure 4:
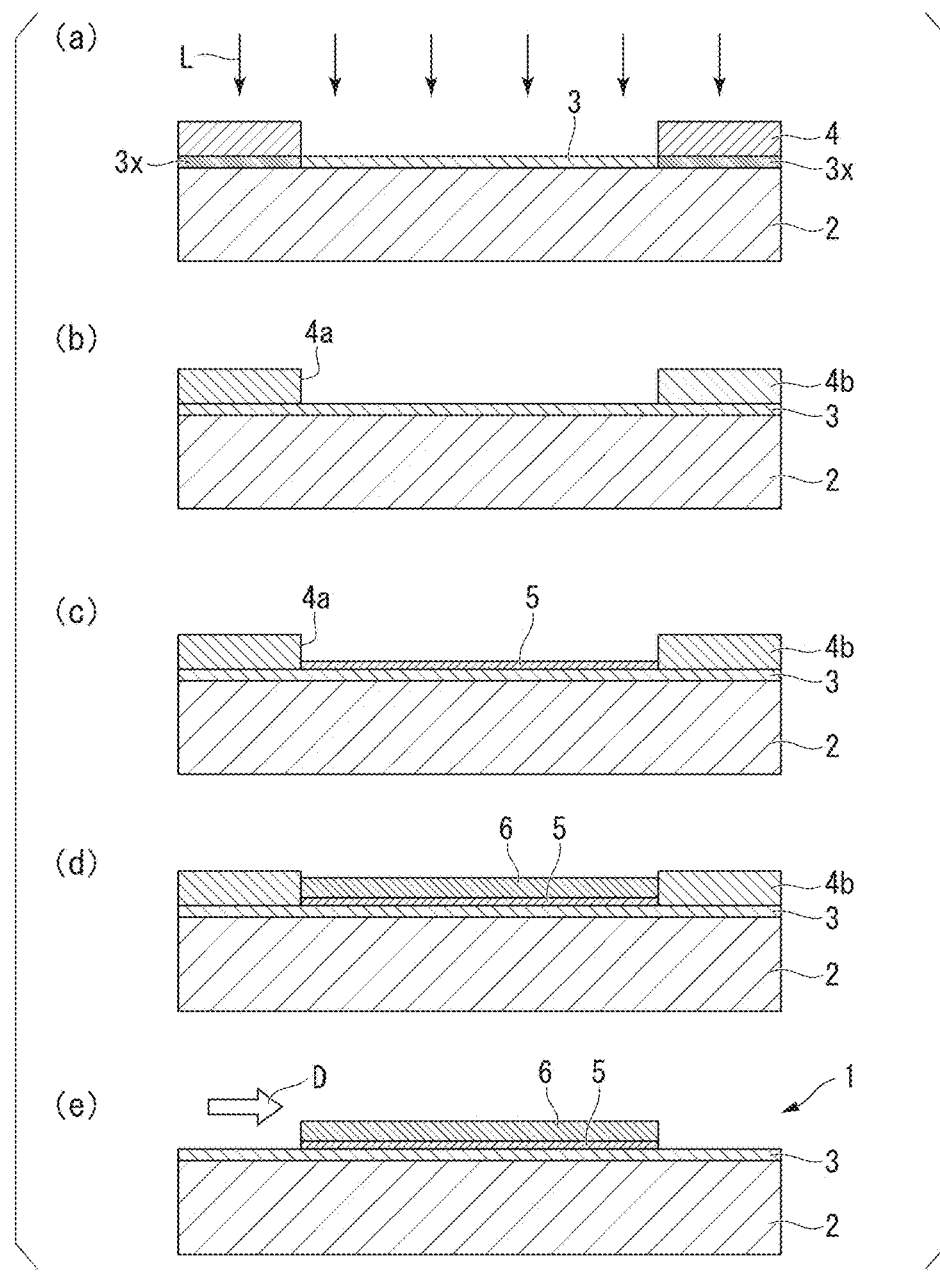
FIG. 4 is a processing diagram illustrating a modified example of the wiring pattern production method.

FIG. 4 is a processing view illustrating a modified example of the wiring pattern production method of the present embodiment. In this modified example, after a method similar to the above-mentioned method is performed until the development of the resist layer illustrated in FIG. 3(b), the ultraviolet light L is exposed to the entire surface before the catalyst 5 to be used for electroless plating is deposited on the surface of the base film 3 exposed in the opening of the resist layer 4 as illustrated in FIG. 4(a).

Thereby, as illustrated in FIG. 4(b), the resist layer 4 becomes a soluble layer in a developing solution (indicated by reference sign 4b in the drawing). Also, in the precursor film 3x of a part overlapping the resist layer 4 in two dimensions, the deprotection reaction proceeds and the base film 3 is formed.

Further, even when the deprotection reaction is insufficient and the protecting group remains in the base film 3 exposed in the opening 4a of the resist layer 4b, it is possible to cause the deprotection reaction in the base film 3 of a relevant position by exposure illustrated in FIG. 4(a) to proceed and generate the amino group.

Also, before moving to the next step, the surface of the base film 3 within the opening 4a may be optionally cleaned using a solvent which does not dissolve the resist layer 4b.

Next, as illustrated in FIG. 4(c), as in FIG. 3(c), the catalyst 5 to be used for the electroless plating is deposited on the base film 3 exposed in the opening 4a of the resist layer 4b. Because the deprotection reaction proceeds by the exposure illustrated in FIG. 4(a) and the amino group is generated in the base film 3 of the relevant position, it is possible to easily increase the amount of the catalyst 5 supported to be more than when there is no exposure. Thus, it is possible to effectively perform electroless plating to be described below.

Next, as illustrated in FIG. 4(d), as in FIG. 3(d), the wiring pattern 6 is formed selectively using nickel phosphorus as the formation material within the opening 4a by causing an electroless plating solution to come into contact with the catalyst 5.

Next, as illustrated in FIG. 4(e), the resist layer 4b is removed by the developing solution D. Even in this case, it is possible to form the laminate 1 having the wiring pattern 6.

Also, in the above-mentioned wiring pattern production method, the base film 3 is formed using only a formation material (the first formation material) having the amino group protected by a photoreactive protecting group and deprotection is performed through exposure thereafter, but the present invention is not limited thereto.

For example, with the first formation material, a formation material (a second formation material) which includes a group having at least one of a nitrogen atom and a sulfur atom and in which the group having the at least one of the nitrogen atom and the sulfur atom is not protected by the protecting group may be used. As such a material, a silane coupling agent having the group having the at least one of the nitrogen atom and the sulfur atom may be given.

Examples of the group having the nitrogen atom can include an amino group, a urea group, a group obtained by removing one or more hydrogen atoms bonded to a heterocyclic compound containing a nitrogen atom, etc. Also, examples of the group having the sulfur atom can include a thiol group (or a mercapto group), a thiocarbonyl group, a thiourea group, a group obtained by removing one or more hydrogen atoms bonded to a heterocyclic compound containing a sulfur atom, etc. Examples of the "heterocyclic compound containing a nitrogen atom or a sulfur atom" include monocyclic aromatic heterocyclic compounds such as pyrrole, imidazole, pyridine, pyrimidine, and thiophene; polycyclic aromatic heterocyclic compounds such as indole and benzothiophene; and non-aromatic heterocyclic compounds in which two or more carbon atoms in an aromatic ring of each of these aromatic compounds are hydrogenated.

Through the combined use of such a second formation material, the second formation material retains the catalyst 5 in cooperation even when the deprotection reaction is insufficient and the protecting group remains, for example, in the base film 3 at a position for retaining the catalyst 5. Thus, it is possible to increase the amount of catalyst supported 5 and it is possible to perform electroless plating effectively.

When the second formation material is a tertiary amine or a silicon compound having another "group capable of being bonded with a metal," it is possible to deposit the electroless plating catalyst 5 on the base film 3 by performing a general process using the above-mentioned accelerator (an activation process) after coating the colloidal solution of divalent palladium salt.

Also, the exposure of the resist layer and the exposure of the precursor film are simultaneously performed in the above-mentioned wiring pattern production method, but the present invention is not limited thereto. For example, because a wavelength of light for changing the solubility in a developing solution of the resist layer is different from a wavelength of light for causing a deprotection reaction of the protecting group, the exposure of the resist layer and the exposure of the precursor film may be separately performed when one reaction is insufficient in exposures using the same light source.

[Transistor Production Method]

Hereinafter, a transistor production method according to the embodiment will be described with reference to FIGS. 5 to 9.

Figure 5:
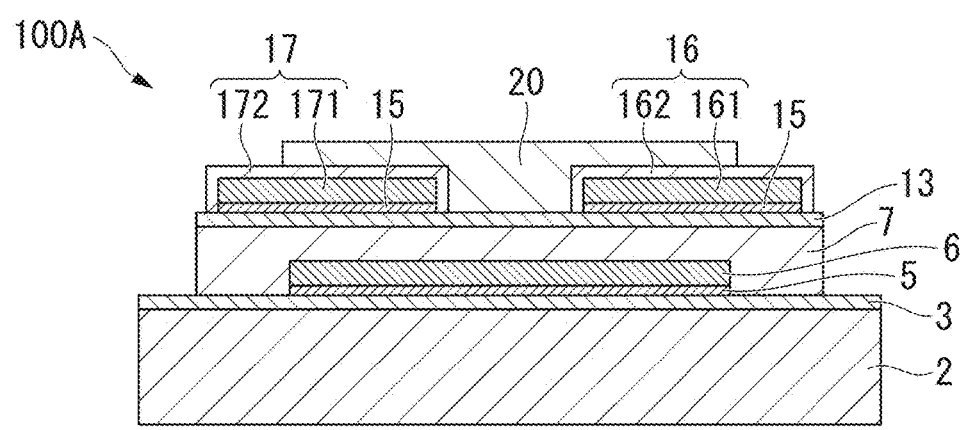
FIG. 5 is a schematic cross-sectional view of a transistor produced in a transistor production method of the present embodiment.
Figure 6:
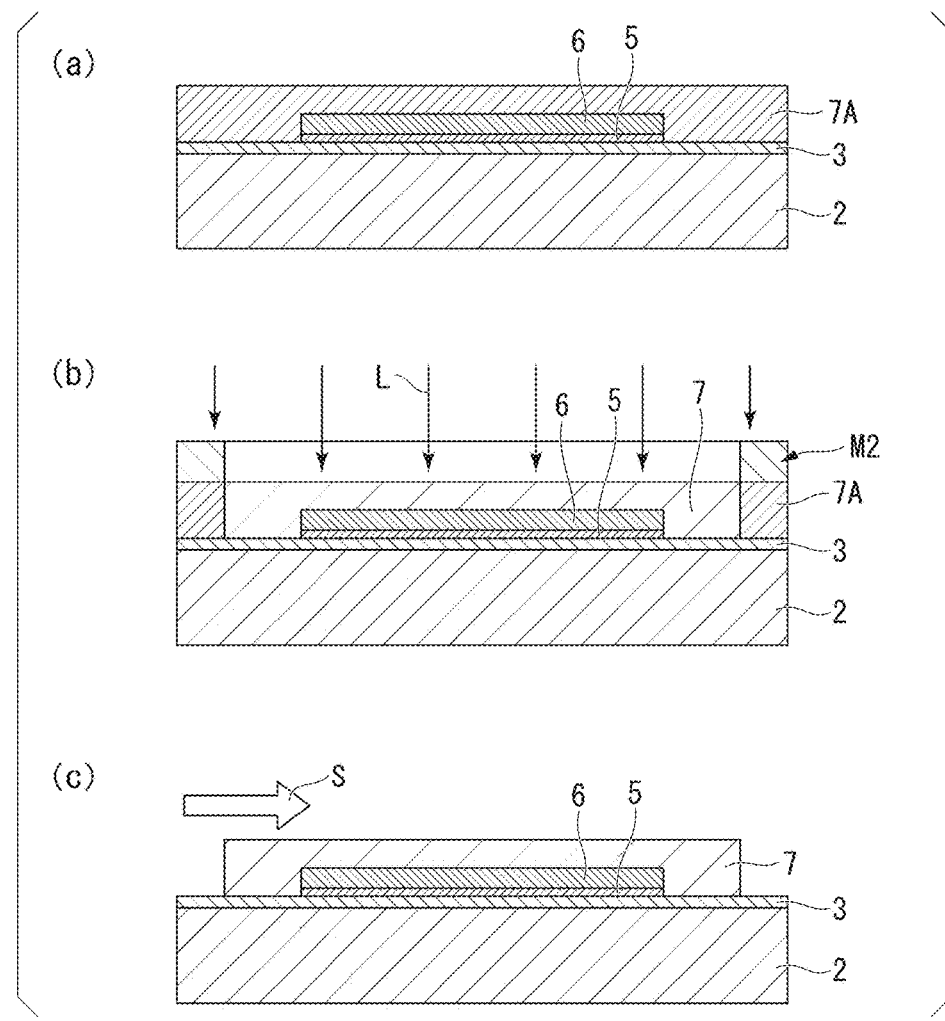
FIG. 6 is a processing diagram illustrating the transistor production method.
Figure 7:
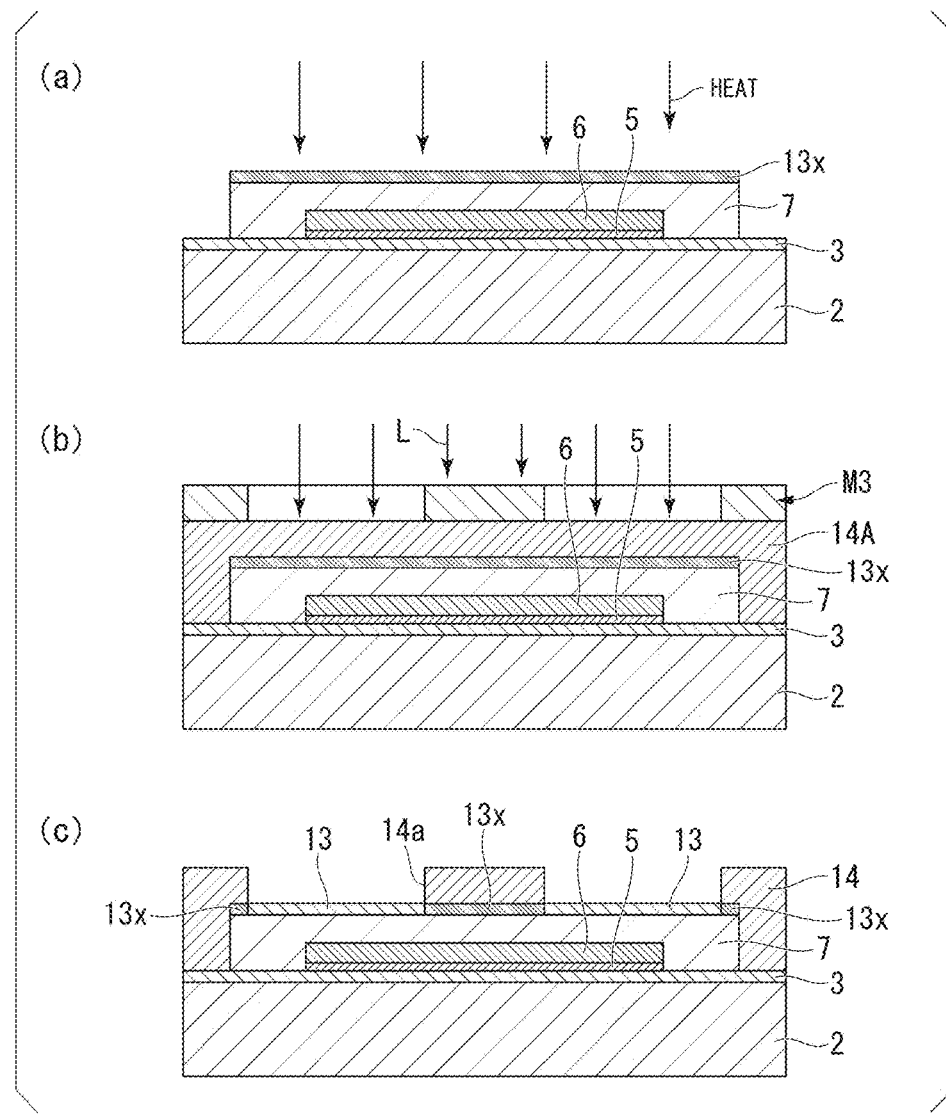
FIG. 7 is a processing diagram illustrating the transistor production method.
Figure 8:
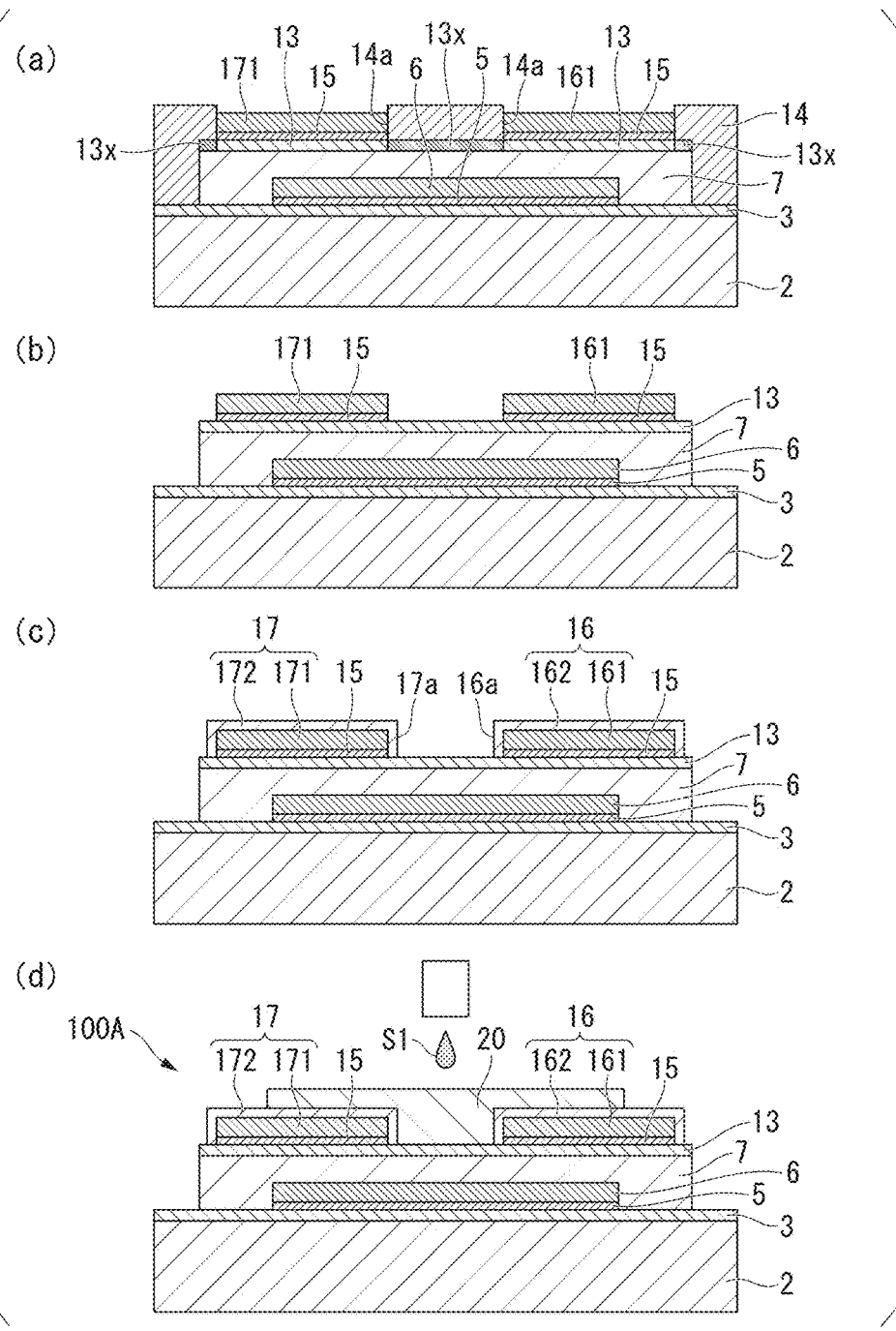
FIG. 8 is a processing diagram illustrating the transistor production method.

FIG. 5 is a schematic cross-sectional view illustrating a transistor produced by the transistor production method of the present embodiment. A transistor 100A is a so-called bottom-contact type transistor. In the following description, an organic transistor using an organic semiconductor will be described as a formation material of a semiconductor layer, but the present invention is also applicable to an inorganic transistor using an inorganic semiconductor as the formation material of a semiconductor layer.

The transistor 100A includes a substrate 2, base films 3 and 13, electroless plating catalysts 5 and 15, a gate electrode (wiring) 6, an insulator layer 7, a source electrode 16, a drain electrode 17, and an organic semiconductor layer (a semiconductor layer) 20.

For the substrate 2, the base film 3 and the catalyst 5, the same elements as those used in the above-mentioned laminate 1 are assumed to be used. For the gate electrode 6, the wiring pattern 6 of the above-mentioned laminate 1 is assumed to be used as the gate electrode.

The insulator layer 7 is provided on the entire surface to cover a surface of the gate electrode 6 and the base film 3. As long as the gate electrode 6 having an insulating property can be electrically insulated from the source electrode 16 and the drain electrode 17 provided on the surface of the insulator layer 7, the insulator layer 7 may be formed using one of an inorganic material and an organic material. Among the materials, it is preferable to use a photocurable resin material as a formation material because production or microfabrication is easy. For example, an ultraviolet-curing acrylic resin, an epoxy resin, an ene-thiol resin, a silicone resin, etc. can be given as the formation material of the insulator layer 7.

The base film 13 is formed on an entire upper surface of the insulator layer 7. The base film 13 is a source base film and is a drain base film in the present invention, and the source base film and the drain base film are formed as a continuous film. The base film 13 is formed over the entire surface of a main side of the substrate 2, and part of the surface of the base film 13 is selectively provided with the catalyst (the electroless plating catalyst) 15. A formation material of the catalyst 15 can be similar to that of the above-mentioned catalyst 5.

A formation material of the base film 13 is the same as that of the above-mentioned base film 3, but the formation materials of the base film 3 and the base film 13 may be different from each other. In the following description, a case where the base film 13 is formed by using a silane coupling agent as a primary amine which is the same as that used for the base film 3 will be described.

In the drawing, the base film 13 is shown as being formed on the entire upper surface of the insulator layer 7, but the base film 13 may be selectively formed on only a location where the catalyst 15 is provided. In this case, a silane coupling agent, which is the formation material of the base film 13, is selectively applied to the upper surface of the insulator layer 7 using a generally known method, and thereby it is possible to selectively form the base film 13. Also, on the upper surface of the insulator layer 7, first, the silane coupling agent may be applied to a region larger than the region forming the base film 13, and then a film formed at a portion protruding from the region forming the base film 13 may be irradiated with ultraviolet light to decompose and remove the silane coupling agent and selectively form the base film 13.

The source electrode 16 and the drain electrode 17 are metallic electrodes formed on the surface of the catalyst 15. The source electrode 16 has a first electrode 161 and a second electrode 162 covering the surface of the first electrode 161. Likewise, the drain electrode 17 has a third electrode 171 and a fourth electrode 172 covering the surface of the third electrode 171.

Similar to the above-mentioned gate electrode 6, the first electrode 161 and the third electrode 171 are formed by electroless plating. As the material of each of the first electrode 161 and the third electrode 171, nickel phosphorus (NiP) or copper (Cu) is given. The first electrode 161 and the third electrode 171 may be formed of the same material or of different materials. In the present embodiment, nickel phosphorus (work function: 5.5 eV) is described as being used as a formation material of each of the first electrode 161 and the third electrode 171.

The second electrode 162 and the fourth electrode 172 are metallic plating layers formed to cover the entire surface of each of the first electrode 161 and the third electrode 171, that is, a surface not in contact with the catalyst 15. That is, the second electrode 162 is provided to cover a lateral side 16a in the source electrode 16, the fourth electrode 172 is provided to cover a lateral side 17a in the drain electrode 17, and the lateral sides 16a and 17a (opposing surfaces) face each other.

As a formation material of each of the second electrode 162 and the fourth electrode 172, a metal material having a work function in which an electron transfer (or a hole transfer) is eased in relation to a HOMO/LUMO level of a formation material of a semiconductor layer 20 to be described below is used. The second electrode 162 and the fourth electrode 172 may be formed of the same material or of different materials. In the present embodiment, gold (work function: 5.4 eV) is described as being used as the formation material of each of the second electrode 162 and the fourth electrode 172.

The semiconductor layer 20 is provided on the surface of the base film 13 between the source electrode 16 and the drain electrode 17 and is formed to be in contact with the source electrode 16 and the drain electrode 17. Specifically, the semiconductor layer 20 is provided to be in contact with the lateral side 16a of the source electrode 16 and the lateral side 17a of the drain electrode 17 and is in contact with the second electrode 162 and the fourth electrode 172.

As the formation material of the semiconductor layer 20, generally known organic semiconductor materials can be used. Examples of the semiconductor materials may include p-type semiconductors such as copper phthalocyanine (CuPc), pentacene, rubrene, tetracene, and P3HT (poly (3-hexylthiophene-2, 5-diyl)) and n-type semiconductors such as fullerenes such as $C_{60}$ and perylene derivatives such as PTCDI-C8H (N,N'-dioctyl-3,4,9,10-perylene tetracarboxylic diimide). Among these, soluble pentacene such as TIPS pentacene (6,13-bis (triisopropylsilylethynyl)pentacene) or an organic semiconductor polymer such as P3HT is soluble in an organic solvent such as toluene, and the semiconductor layer 20 can be preferably formed by a wet process. In the present embodiment, TIPS pentacene (HOMO level: 5.2 eV), which is a p-type semiconductor, will be described as being used as the formation material of the semiconductor layer 20.

Further, the formation material of the semiconductor layer 20 is not limited to organic semiconductor materials, and generally known inorganic semiconductor materials can also be used as the formation material of the semiconductor layer 20.

As mentioned above, the work function of nickel phosphorus which is the formation material of the first electrode 161 and the third electrode 171 is 5.5 eV, the work function of gold which is the formation material of the second electrode 162 and the fourth electrode 172 is 5.4 eV, and the HOMO level of TIPS pentacene which is the formation material of the semiconductor layer 20 is 5.2 eV. That is, on the surfaces of the source electrode 16 and the drain electrode 17, the second electrode 162 and the fourth electrode 172 are formed using a metal material having a work function in which an electron transfer with the formation material of a semiconductor layer 20 is easier (an energy level difference from HOMO of the semiconductor layer 20 is smaller) than in the first electrode 161 and the third electrode 171. Thus, Schottky resistances between the semiconductor layer 20, the source electrode 16, and the drain electrode 17 can be reduced and it is possible to satisfactorily transfer electrons during driving.

In this transistor 100A, the gate electrode 6, the source electrode 16, and the drain electrode 17, which are formed by electroless plating, are formed on the base films 3 and 13 (a gate base film, a source base film, and a drain base film), which are formed by using a silane coupling agent as the formation material. For example, when these electrodes are formed in a region having an uneven shape, the uneven shape is imparted to each of these electrodes by reflecting the unevenness of a base. In this case, a distance between the electrodes laminated via an insulator layer is not constant, and insulation may be damaged and a leak current may be generated at a position where the distance between the gate electrode and the source electrode or a distance between the gate electrode and the drain electrode approaches to each other. Also, if the base has an uneven shape, an uneven shape may be imparted even to a channel region of the semiconductor layer overlapping the gate electrode in two dimensions, and a movement distance of a carrier in the channel region may be lengthened, thereby deteriorating the performance of transistors.

However, in the transistor 100A of the present embodiment, because the base films 3 and 13 are formed using a silane coupling agent as the formation material and a base film containing a filler component capable of roughening the surface of the substrate is not used, these base films become smooth films. Therefore, uneven shapes are not formed by forming the base films 3 and 13, and the problems caused by the uneven shapes do not occur, and therefore the transistor 100A becomes a high-performance transistor.

Hereinafter, the method of producing the above-mentioned transistor 100A will be described with reference to FIGS. 6 to 9.

First, in a method similar to the above-mentioned wiring pattern production method of the present embodiment, the gate electrode 6 is formed in one main surface of the substrate 2.

Next, as illustrated in FIG. 6(a), a coating solution obtained by dissolving a precursor of a resin material having an insulating property in an organic solvent is coated on a surface of the base film 3 while covering the gate electrode 6. It is possible to use the above-mentioned method as a coating method.

As the resin material, for example, it is possible to use an ultraviolet-curing acrylic resin, an epoxy resin, an ene-thiol resin, and a silicone resin. Also, as the organic solvent, it is possible to preferably use a polar solvent similar to a coating liquid related to the coating film 3A. Also, by changing a concentration and type of organic solvent in the coating liquid, it is possible to adjust the viscosity of the entire coating liquid and control a thickness of a coating film 7A of the coating liquid.

In the process illustrated in FIG. 6(a), thick coating is performed so that the coating film 7A has a thickness of about several hundred nm to suppress leakage between the gate electrode 6 and the source electrode and the drain electrode.

Next, as illustrated in FIG. 6(b), via a mask M2 in which an opening is provided in correspondence with a region for forming the insulator layer 7, a resin material is cured by radiating ultraviolet light L to the coating film 7A and the insulator layer 7 is formed. At this time, in order to accelerate a curing reaction of the resin material, a heat treatment is preferably performed simultaneously with ultraviolet light radiation or after the ultraviolet light irradiation.

Next, as illustrated in FIG. 6(c), by performing development in a solvent S for dissolving the coating film, an uncured coating film is removed and the patterned insulator layer 7 is formed.

Also, a state in which a coating solution obtained by dissolving the precursor of a resin material having an insulating property in an organic solvent is coated on the surface of the base film 3 while covering the gate electrode 6 and the insulator layer 7 is formed by radiating ultraviolet light and curing the precursor has been described here, but a silane coupling agent may be coated to cover the surface including the gate electrode 6 before the coating solution is coated thereon to improve the adhesion with the insulator layer 7 and the gate electrode 6.

Next, as illustrated in FIG. 7(a), a liquid substance obtained by optionally dissolving the above-mentioned first formation material is coated on the entire upper surface of the insulator layer 7, a heat treatment is performed to remove the organic solvent by volatilization, and a precursor film 13x is formed. Materials similar to those exemplified in the formation of the above-mentioned precursor film 3x can be used as the first formation material and the organic solvent.

Next, as illustrated in FIG. 7(b), the resist material is coated to cover the insulator layer 7 and the precursor film 13x and a resist layer 14A which is not patterned is formed by pre-baking. Here, a positive photoresist is used as the resist material.

Thereafter, via a mask M3 in which an opening is provided in correspondence with a region for forming the source electrode and the drain electrode, the ultraviolet light L which is pattern light is radiated to the resist layer 14A and the resist layer 14A is exposed. Simultaneously, the base film 13 is generated by exposing the precursor film 13x and causing the deprotection reaction to proceed.

Next, as illustrated in FIG. 7(c), the resist layer 14A is removed until the base film 13 is exposed in correspondence with the pattern light by developing the resist layer irradiated with the ultraviolet light in the developing solution D and the resist layer 14 in which an opening 14a is provided is formed.

Next, as illustrated in FIG. 8(a), the catalyst 15 used in electroless plating is deposited on the surface of the base film 13 by causing a colloid solution of divalent palladium salt to come into contact with the base film 13 exposed on the opening 14a. Thereafter, by causing an electroless plating solution to come into contact with the catalyst 15, the metal ions dissolved in the electroless plating solution on the surface of the catalyst 15 are deposited by reduction and the first electrode 161 and the third electrode 171 in which nickel phosphorous is selectively used are formed within the opening 14a.

Next, as illustrated in FIG. 8(b), the entire surface of the remaining resist layer is exposed to ultraviolet light. Through this exposure, the deprotection reaction proceeds in the precursor film 13x overlapping the resist layer in two dimensions and the base film 13 is formed. Thereafter, the resist layer is removed by the generally known developing solution D. Thus, the first electrode 161 and the third electrode 171 are formed.

Next, as illustrated in FIG. 8(c), gold is subjected to substitution deposition on the surfaces of the first electrode 161 and the third electrode 171 by immersing them in their entirety in a substitution gold plating bath and the second electrode 162 and the fourth electrode 172 in which gold serves as the formation material are formed on the surfaces of the first electrode 161 and the third electrode 171 by further immersing them in a reduced gold plating bath. Thus, the source electrode 16 and the drain electrode 17 are formed.

Next, as illustrated in FIG. 8(d), a solution S1 prepared by dissolving organic semiconductor material soluble in the organic solvent into an organic solvent such as TIPS pentacene is coated between the source electrode 16 and the drain electrode 17 and dried so that the semiconductor layer 20 is formed. Here, the semiconductor layer 20 is formed by a wet method, but it is also possible to use a method such as a sublimation method or a transfer method.

As mentioned above, the transistor 100A can be produced.

According to the method of producing a transistor of the above-mentioned configuration, it is possible to form a desired electrode with high dimensional precision because the above-mentioned wiring pattern production method is used in the formation of the gate electrode 6, the source electrode 16, and the drain electrode 17. Thus, it is possible to produce a high-performance transistor using an electroless plating method Also, an example in which all of the gate electrode 6, the source electrode 16, and the drain electrode 17 are formed using the above-mentioned wiring pattern production method has been described in the present embodiment, but the above-mentioned wiring pattern production method may be used when at least one of the gate electrode 6, the source electrode 16, and the drain electrode 17 is formed.

(Modified Example 1)

Also, the production of the bottom contact type transistor 100A has been described in the present embodiment, but the present invention is not limited thereto.

Figure 9:
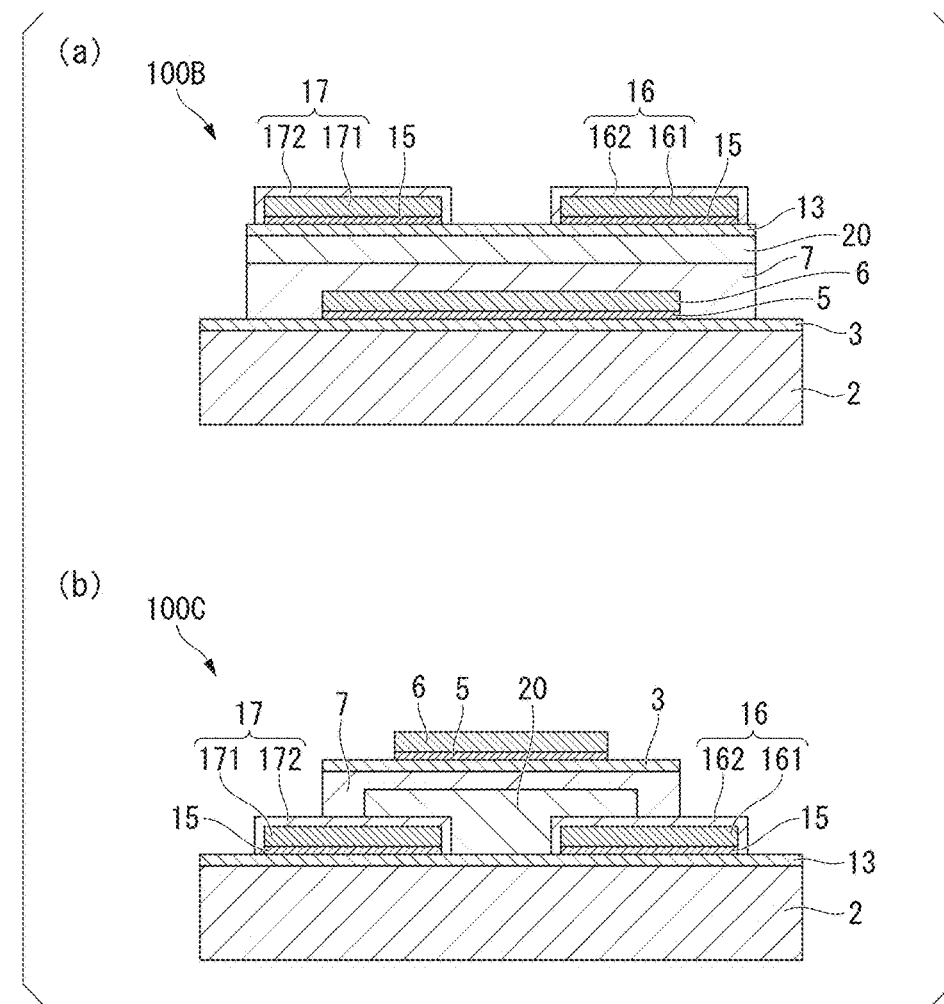
FIG. 9 is a schematic cross-sectional view illustrating a modified example of a transistor produced in the transistor production method of the present embodiment.

FIG. 9 is a schematic cross-sectional view illustrating a modified example of a transistor produced by the transistor production method of the present embodiment. In the description of the modified example, components common to the configuration of the above-mentioned transistor 100A are assigned the same reference signs and detailed description thereof will be omitted.

A transistor 100B illustrated in FIG. 9(a) is a so-called top contact type transistor. The transistor 100B includes the semiconductor layer 20 in which the source electrode 16 and drain electrode 17 are formed on the surface disposed on the insulator layer 7. That is, the semiconductor layer 20 is formed on the entire upper surface of the insulator layer 7, and the base film 13 is formed on an entire upper surface of the semiconductor layer 20.

On the upper surface of the base film 13, the catalyst 15 is selectively provided, the source electrode 16 having the first electrode 161 and the second electrode 162 and the drain electrode 17 having the third electrode 171 and the fourth electrode 172 are formed.

Such a transistor 100B can be produced by forming the gate electrode 6 on the substrate 2, forming the semiconductor layer 20 and the insulator layer 7 (a layer including an insulator layer) while covering the gate electrode 6, and forming the source electrode 16 and the drain electrode 17 on the surface of the layer including the insulator layer.

A transistor 100C illustrated in FIG. 9(b) is a so-called top gate-bottom type transistor. The transistor 100C is provided with the substrate 2, the base film (plating base film) 13 provided on the surface of the substrate 2, and the source electrode 16 and the drain electrode 17 provided on the surface of the base film 13.

The semiconductor layer 20 in contact with the source electrode 16 and the drain electrode 17 is provided between the source electrode 16 and the drain electrode 17, and the insulator layer 7 is provided to cover the source electrode 16, the drain electrode 17 and the semiconductor layer 20.

The base film 3 and the catalyst 5 are provided on the surface of the insulator layer 7, and the gate electrode 6 is provided on the catalyst 5.

Such a transistor 100C can be produced by forming the source electrode 16 and the drain electrode 17 on the substrate 2, forming the semiconductor layer 20 and the insulator layer 7 (a layer including an insulator layer) while covering the source electrode 16 and the drain electrode 17, and forming the gate electrode 6 on the surface of the layer including the insulator layer.

Even in the transistors 100B and 100C, the above-mentioned wiring pattern production method is used when at least one of the gate electrode 6, the source electrode 16, and the drain electrode 17 is formed. That is, it is possible to form a desired electrode with high dimensional precision by forming one or both of the precursor film 3x and the precursor film 13x using the above-mentioned first formation material and forming the base films 3 and 13 by exposing the precursor films 3x and 13x. Thus, it is possible to produce a high-performance transistor using an electroless plating method.

Heretofore, examples of embodiments of the present invention have been described with reference to the accompanying drawing, but the present invention is not limited to the examples. The shapes, combination, and the like of the components described in the above-mentioned examples are merely examples and can be variously modified based on design requirements and the like without departing from the scope of the present invention.

For example, a substrate can be made of a non-metallic material. It is possible to form a high-performance transistor on a PET substrate by preparing a plurality of plating members in which a base film is formed on the PET substrate using the PET substrate which is a non-metallic material and producing a transistor using the above-mentioned production method in a conveyance process while conveying the plurality of plating members.

Moreover, it is possible to form a transistor on a PET film in a roll-to-roll process of winding a plating member in which a base film is formed on a long PET film having flexibility as a substrate in a roll shape, conveying the plating member while unwinding the plating member, continuously producing transistors using the above-mentioned production method, and winding the produced transistors in a roll shape.

Further, a gate electrode, a source electrode and a drain electrode are formed by forming a base film using a silane coupling agent as a formation material, depositing an electroless plating catalyst on the base film, and performing electroless plating in the present embodiment, but these electrodes may also be formed by forming any one or two electrodes of these electrodes using the above-mentioned method and forming the remaining electrodes using another method. For example, the gate electrode may be formed using a generally known patterning method, and the source electrode and drain electrode formed in the same layer may be formed using the above-mentioned production method.

EXAMPLES

Hereinafter, the present invention will be described in more detail with reference to the following examples, but the scope of the present invention is not limited to these examples.

In the present embodiment, a compound shown in the above-mentioned formula (2) ((4, 5-dimethoxy-2-nitrobenzyl (3-(trimethoxysilyl) propyl) carbamate; NBC-APTMOS) was used as the first forming material.

After chloroform was added to NBC-APTMOS so that a concentration of 1 wt % was reached, ultrasonic processing was performed to adjust a liquid substance and dust and foreign substances were removed, the adjusted liquid substance was used to form the base film by filtration. Ultrasonic processing was performed under conditions of a frequency of 45 kHz, a high frequency output of 100 W, and a processing time of 3 minutes using a desktop ultrasonic cleaner (VS-100III produced by Velvo-Clear). In the following description, the liquid substance adjusted in the above method is referred to as "liquid substance 1."

Also, methyl isobutyl ketone (hereinafter referred to as MIBK) was added to NBC-APTMOS so that 0.2 mass % was reached, a liquid substance was adjusted through filtration after ultrasonic processing was performed, and the adjusted liquid substance was used to form the base film. In the following description, the liquid substance adjusted in the above method is referred to as "liquid substance 2."

Also, methyl isobutyl ketone (hereinafter referred to as MIBK) was added to NBC-APTMOS so that 0.2 wt % was reached, and filtration was performed after ultrasonic processing was performed. After 3-aminopropyltriethoxysilane (KBE903, made by Shin-Etsu Silicone Co., Ltd.) was added to a filtrate so that 0.2 wt % was reached and the liquid substance was adjusted and filtered by performing the ultrasonic processing, the filtered liquid substance was used to form the base film. In the following description, the liquid substance prepared in the above method is referred to as "liquid substance 3."

Also, a liquid substance was prepared by dissolving KBE 903 in MIBK so that 0.2 wt % was reached and the prepared liquid substance was used. In the following description, the liquid substance adjusted in the above-mentioned method is referred to as "liquid substance 4."

[Wiring Pattern Formation 1]

Example 1

After the surface of a PET substrate (model number: A-4100 (without coating) made by Toyobo Co., Ltd.) was washed by an atmospheric pressure oxygen plasma, the liquid substance 1 was coated on the PET substrate by spin coating. The spin coating was performed under the condition of a revolution speed of 3000 rpm for 10 seconds. Thereafter, a plating base film was formed by heating at 105° C. for 15 minutes.

Next, a resist layer was formed by spin-coating a 2-heptane solution (2-fold dilution (mass ratio)) of a resist material (SUMIRESIST PFI-34A6 made by Sumitomo Chemical Co., Ltd.) for the PET substrate in which a plating base film was formed and heating the spin-coated solution at 105° C. for 5 minutes (pre-baking). The spin coating was performed under the condition of a rotational speed of 3000 rpm for 30 seconds. The formed resist layer had a film thickness of about 300 nm.

Next, after the resist layer was exposed to ultraviolet light (i-line, a wavelength of 365 nm) with an intensity of 29 mW/cm$^2$ via a photomask for 50 seconds and was heated at 105° C. for 5 minutes (post-baking), a mask pattern was developed in the resist layer and an opening was formed by immersing the resist layer in a 2.38% TMAH solution for 1.5 minutes.

Next, after the substrate in which the opening was formed in the resist layer was subjected to ultrasonic water washing at room temperature for 30 seconds, it was immersed in a colloidal catalyst solution for electroless plating (Melplate Activator 7331 made by Meltex Inc.) at room temperature for 60 seconds and the catalyst was attached to the plating base film exposed in the opening of the resist layer.

Next, after water washing the surface, nickel phosphorous plating was performed by performing immersion in an electroless plating solution (Melplate NI-867 made by Meltex Inc.) at 73° C. for 60 seconds and depositing nickel phosphorus (NiP) on the catalyst attached to the opening of the resist layer.

Next, after the surface was water-washed and dried and the entire surface including the remaining resist layer was exposed to ultraviolet light (i-line, a wavelength of 365 nm) of an intensity of 29 mW/cm$^2$ for 1 minute, the resist layer was removed by performing immersion in ethanol for 1 minute and a wiring pattern was prepared.

Example 2

After a surface of a PET substrate was washed by atmospheric pressure oxygen plasma, the liquid substance 2 was coated on the PET substrate by dip coating. The pulling speed of the dip coating was 1 mm/sec. Thereafter, a plating base film was formed by performing heating at 105° C. for 15 minutes.

Also, even in the following process, the above-mentioned condition was adopted for the pulling speed of the dip coating.

Next, with respect to the PET substrate in which the base film was formed, a resist layer was formed by performing dip coating on a resist material (SUMIRESIST PFI-34A6 made by Sumitomo Chemical Co., Ltd.) and heating the dip-coated resist material at 105° C. for 5 minutes (pre-baking).

Next, after the resist layer was exposed to ultraviolet light (i-line, a wavelength of 365 nm) of an intensity of 29 mW/cm$^2$ via a photomask for 2 seconds and was heated at 105° C. for 5 minutes (post-baking), a mask pattern was developed in the resist layer and an opening was formed by immersing the resist layer in a 2.38% TMAH solution for 1.5 minutes.

Next, the ultraviolet light (i-line, a wavelength of 365 nm) of the intensity of 29 mW/cm$^2$ was radiated to the entire surface for the PET substrate in which the resist layer was formed for 60 seconds.

Next, as in Example 1, nickel phosphorous plating was performed after ultrasonic water washing was performed on the substrate in which the opening was formed in the resist layer.

Next, the resist layer was removed by performing immersion for 1 minute in ethanol and a wiring pattern was prepared.

Example 3

A resist layer in which an opening was formed on a PET substrate was formed as in Example 2, except that a base film was formed using the liquid substance 3.

Next, as in Example 1, a wiring pattern was prepared.

Comparative Example 1

A wiring pattern was prepared as in Example 3, except that a base film was formed using the liquid substance 4.

Figure 10:
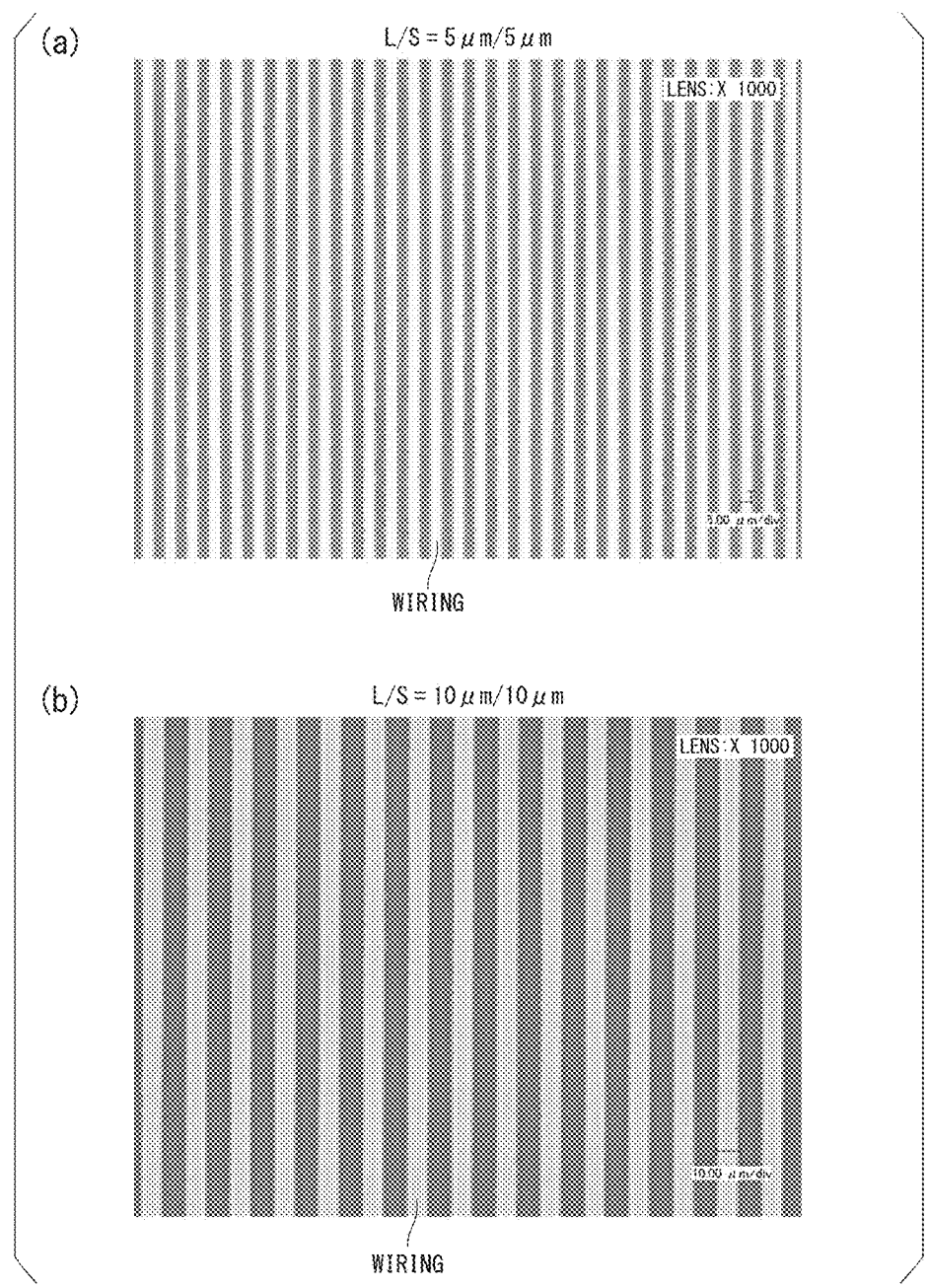
FIG. 10 is a photograph illustrating a result of an example.
Figure 11:
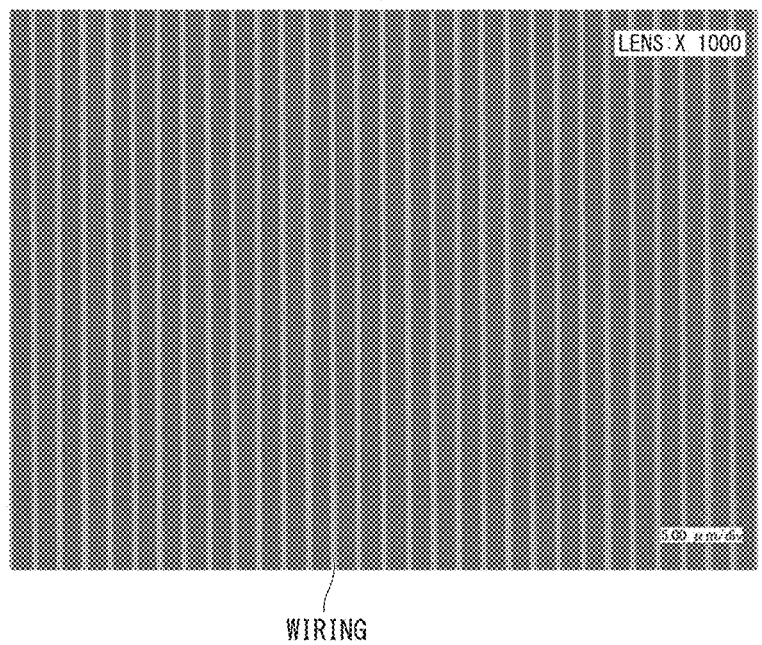
FIG. 11 is a photograph illustrating a result of an example.
Figure 12:
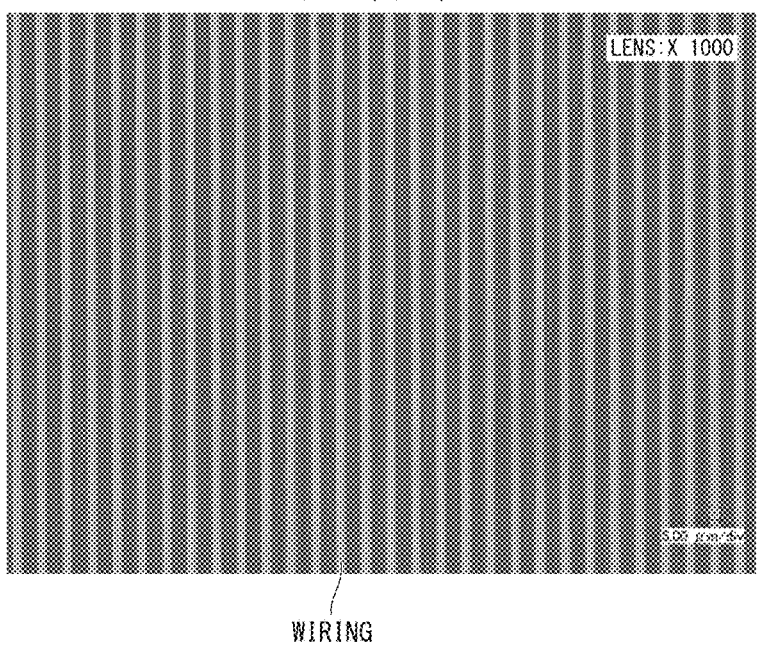
FIG. 12 is a photograph illustrating a result of an example.
Figure 13:
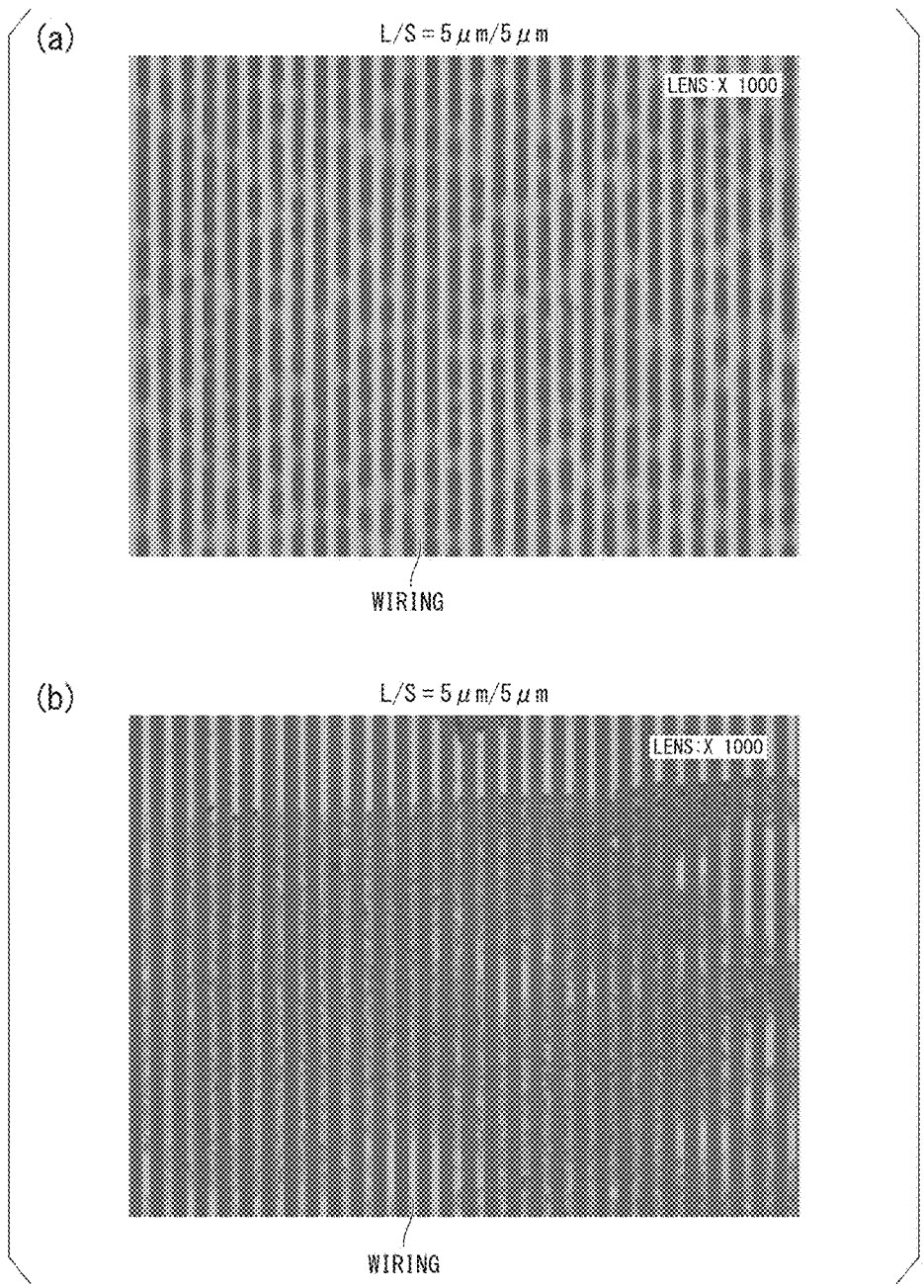
FIG. 13 is a photograph illustrating a result of an example.

FIGS. 10 to 13 are optical microscope photographs of a prepared wiring pattern. In the photos, a white part is wiring. FIG. 10 illustrates the wiring pattern formed in Example 1, FIG. 11 illustrates the wiring pattern formed in Example 2, FIG. 12 illustrates the wiring pattern formed in Example 3, and FIG. 13 illustrates the wiring pattern formed in Comparative Example 1.

As illustrated in FIG. 10, in Example 1, the wiring pattern was formed to a uniform width even in the condition of L/S=10 μm/10 μm (FIG. 10(*b*)) and the further fine condition of L/S=5 μm/5 μm (FIG. 10(*a*)). Also, as illustrated in FIGS. 11 and 12, as in the wiring patterns of Examples 2 and 3, the wiring pattern was formed to a uniform width.

As illustrated in FIG. 13, for the wiring pattern of Comparative Example 1, a width was uniform (FIG. 13(*a*)), a surface was rough (FIG. 13(*b*)), and wiring dimensional precision was lowered. Also, FIGS. 13(*a*) and 13(*b*) are results obtained by performing two experiments in the same condition.

[Wiring Pattern Formation 2]

Example 4

In a method similar of that of Example 3, a gate electrode was formed on a PET substrate. An epoxy resin-based ultraviolet-curing resin (SU-8 made by Nippon Kayaku Co., Ltd.) was dip-coated on the PET substrate on which a gate electrode was formed and heated at 105° C. for 10 minutes (pre-baking) to form a coating film of an ultraviolet-curing resin.

Next, the coating film was exposed to the ultraviolet light (i-line, wavelength 365 nm) of an intensity of 29 mW/cm$^2$ for 5 seconds via a photomask and heated at 105° C. for 60 minutes (post-baking).

Next, patterning was performed by removing a part not irradiated with the ultraviolet light through immersion in a developing solution (propylene glycol-1-methyl ether 2-acetate, PEGMEA). Thereafter, a heat treatment was performed at 105° C. for 30 minutes to form a gate insulation film.

Next, in a method similar to that of Example 3, a first electrode and a third electrode which are nickel phosphorous electrodes corresponding to a source electrode and a drain electrode of a gate insulation film were prepared.

Next, electroless gold plating was performed by performing immersion in a substitution gold bath for 1 minute and further performing immersion in a reduction plating bath for 3 minutes, a second electrode and a fourth electrode were prepared by covering the surface of the nickel phosphorous electrode with gold, and the source electrode and the drain electrode were prepared.

The formed wiring pattern forms a semiconductor layer to connect the source electrode and the drain electrode and therefore functions as a transistor.

Comparative Example 2

A wiring pattern was prepared as in Example 4, except that a first electrode and third electrode which are nickel phosphorous electrodes were prepared as in Comparative Example 1 when a source electrode and a drain electrode were prepared on a surface of a gate insulation film.

Figure 14:
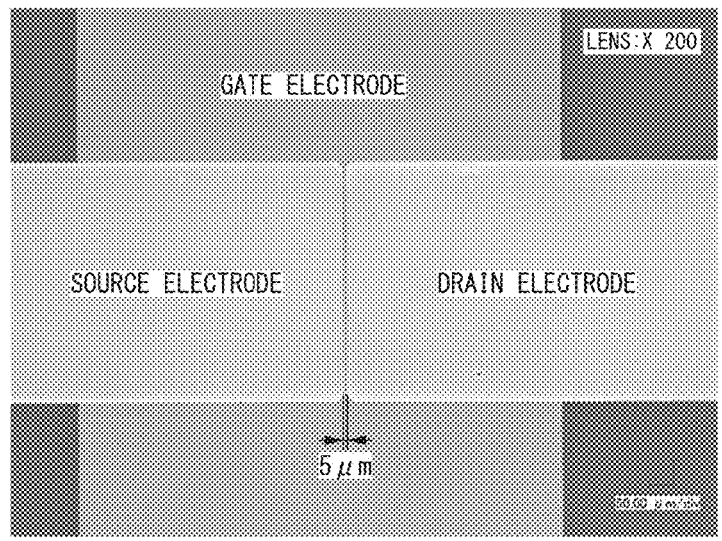
FIG. 14 is a photograph illustrating a result of an example.
Figure 15:
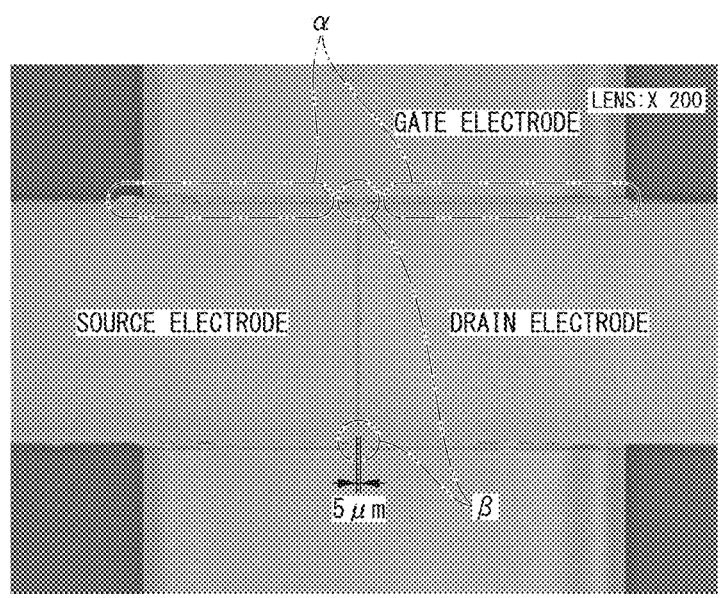
FIG. 15 is a photograph illustrating a result of an example.

FIGS. 14 and 15 are optical microscopic photographs of prepared wiring patterns. FIG. 14 illustrates the wiring pattern formed in Example 4 and FIG. 15 illustrates the wiring pattern formed in Comparative Example 2.

As illustrated in FIG. 14, for the wiring pattern of Example 4, the source electrode and the drain electrode were formed to uniform widths and formed at an interval of 5 μm between the source electrode and the drain electrode.

As illustrated in FIG. 15, the wiring dimensional precision was lowered in the wiring pattern of Comparative Example 2.

In FIG. 15, a part in which a width is irregular was confirmed in a part surrounded by a broken link of reference sign α.

Also, in FIG. 15, a part in which the gate electrode and the drain electrode were short-circuited was confirmed in a part surrounded by a broken line of reference sign β. In FIG. 15, shadows corresponding to end portions of the gate electrode and the drain electrode can be confirmed as black stripes in a part in which the gate electrode and the drain electrode are separated, but a stripe breaks off in a part of the reference sign β. Because the shadow corresponding to an end part of the electrode is not formed in a short-circuited part, it is possible to determine that there is a part in which the gate electrode and the drain electrode are short-circuited.

From the above results, the usefulness of the present invention has been confirmed.

What is claimed is:

1. A wiring pattern production method comprising:
    forming, on a substrate, a precursor film for a plating base film including a first formation material having an amino group protected by a photoreactive protecting group, the first formation material being a silane coupling agent having an amino group protected by the protecting group;
    forming a photoresist layer including a photoresist material on a surface of the precursor film;
    exposing the photoresist layer with a desired pattern of light;
    exposing the precursor film with a desired pattern of light to form the plating base film;
    developing the exposed photoresist layer and removing a deprotected protecting group; and
    depositing an electroless plating catalyst on the exposed surface of the plating base film.

2. The wiring pattern production method according to claim 1,
    wherein the exposing of the photoresist layer and the exposing of the precursor film are simultaneously performed.

3. The wiring pattern production method according to claim 1,
    wherein, after removing the photoresist layer, a remainder of the precursor film is further exposed to light.

4. The wiring pattern production method according to claim 1,
    wherein the protecting group is an o-nitrobenzyl group or a group having an o-nitrobenzyl skeleton.

5. The wiring pattern production method according to claim 1,
    wherein the amino group is a group represented by —NH$_2$.

6. The wiring pattern production method according to claim 1,
    wherein the precursor film includes a group having at least one of a nitrogen atom and a sulfur atom and the group having the at least one of the nitrogen atom and the sulfur atom further includes a second formation material which is not protected by the protecting group.

7. The wiring pattern production method according to claim 6,
    wherein the second formation material is a silane coupling agent having the group having the at least one of the nitrogen atom and the sulfur atom.

8. The wiring pattern production method according to claim 1,
    wherein the substrate is made of a nonmetallic material.

9. The wiring pattern production method according to claim 8,
    wherein the substrate is made of a resin material.

10. The wiring pattern production method according to claim 9,
    wherein the substrate has flexibility.

11. A transistor production method comprising:
    forming at least one of a gate electrode, a source electrode, and a drain electrode on a substrate using the wiring pattern production method according to claim 1.

12. The transistor production method according to claim 11, comprising:
    forming the gate electrode on the substrate;
    covering the gate electrode to form a layer including an insulator layer; and
    forming the source electrode and the drain electrode on a surface of the layer including the insulator layer.

13. The transistor production method according to claim 11, comprising:
    forming the source electrode and the drain electrode on the substrate;
    covering the source electrode and the drain electrode to form a layer including an insulator layer; and
    forming the gate electrode on a surface of the layer including the insulator layer.

14. A wiring pattern production method comprising:
    forming, on a substrate, a precursor film for a plating base film including a first formation material having an amino group protected by a photoreactive protecting group;
    forming a photoresist layer including a photoresist material on a surface of the precursor film;
    exposing the photoresist layer with a desired pattern of light;
    exposing the precursor film with a desired pattern of light to form the plating base film;
    developing the exposed photoresist layer and removing a deprotected protecting group; and
    depositing an electroless plating catalyst on the exposed surface of the plating base film,
        wherein, after removing the photoresist layer, a remainder of the precursor film is further exposed to light.

15. A wiring pattern production method comprising:
    forming, on a substrate, a precursor film for a plating base film including a first formation material having an amino group protected by a photoreactive protecting group;
    forming a photoresist layer including a photoresist material on a surface of the precursor film;
    exposing the photoresist layer with a desired pattern of light;
    exposing the precursor film with a desired pattern of light to form the plating base film, developing the exposed photoresist layer and removing a deprotected protecting group; and
    depositing an electroless plating catalyst on the exposed surface of the plating base film;
        wherein the precursor film includes a group having at least one of a nitrogen atom and a sulfur atom and the group having the at least one of the nitrogen atom and the sulfur atom further includes a second formation material which is not protected by the protecting group.

* * * * *